(12) United States Patent
Nakayama et al.

(10) Patent No.: US 10,266,734 B2
(45) Date of Patent: Apr. 23, 2019

(54) CURABLE COMPOSITION, CURED PRODUCT, METHOD FOR USING CURABLE COMPOSITION, AND OPTICAL DEVICE

(71) Applicant: LINTEC CORPORATION, Tokyo (JP)

(72) Inventors: Hidekazu Nakayama, Tokyo (JP); Masami Matsui, Tokyo (JP); Mikihiro Kashio, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 52 days.

(21) Appl. No.: 15/506,364

(22) PCT Filed: Aug. 21, 2015

(86) PCT No.: PCT/JP2015/073609
§ 371 (c)(1),
(2) Date: Feb. 24, 2017

(87) PCT Pub. No.: WO2016/031731
PCT Pub. Date: Mar. 3, 2016

(65) Prior Publication Data
US 2017/0275513 A1 Sep. 28, 2017

(30) Foreign Application Priority Data

Aug. 26, 2014 (JP) ................. 2014-171419

(51) Int. Cl.
| | |
|---|---|
| *C08K 3/36* | (2006.01) |
| *C09J 183/06* | (2006.01) |
| *C08K 3/00* | (2018.01) |
| *C09J 11/04* | (2006.01) |
| *C09J 11/06* | (2006.01) |
| *C08K 5/5435* | (2006.01) |
| *C08K 5/544* | (2006.01) |
| *C08K 9/06* | (2006.01) |
| *C09K 3/10* | (2006.01) |
| *C08L 83/04* | (2006.01) |
| *H01L 23/29* | (2006.01) |
| *H01L 23/31* | (2006.01) |
| *H01L 33/56* | (2010.01) |
| *C08G 77/04* | (2006.01) |
| *C08G 77/24* | (2006.01) |
| *C08G 77/388* | (2006.01) |
| *C08G 77/392* | (2006.01) |
| *C08K 5/3492* | (2006.01) |
| *H01L 31/0216* | (2014.01) |

(Continued)

(52) U.S. Cl.
CPC ............ *C09J 183/06* (2013.01); *C08G 77/04* (2013.01); *C08G 77/24* (2013.01); *C08G 77/388* (2013.01); *C08G 77/392* (2013.01); *C08K 3/00* (2013.01); *C08K 3/36* (2013.01); *C08K 5/34924* (2013.01); *C08K 5/544* (2013.01); *C08K 5/5435* (2013.01); *C08K 9/06* (2013.01); *C08L 83/04* (2013.01); *C08L 83/06* (2013.01); *C09J 11/04* (2013.01); *C09J 11/06* (2013.01); *C09J 183/04* (2013.01); *C09K 3/10* (2013.01); *H01L 23/29* (2013.01); *H01L 23/31* (2013.01); *H01L 31/0216* (2013.01); *H01L 33/56* (2013.01); *C08G 77/16* (2013.01); *C08G 77/18* (2013.01); *H01L 2924/0002* (2013.01)

(58) Field of Classification Search
None
See application file for complete search history.

(56) References Cited

U.S. PATENT DOCUMENTS 9,670,326 B2 * 6/2017 Matsui ................ C08G 77/392
2005/0069718 A1   3/2005 Voss-Kehl et al.
(Continued)

FOREIGN PATENT DOCUMENTS

| EP | 2 915 834 A1 | 9/2015 |
|---|---|---|
| JP | 2002-313621 A | 10/2002 |

(Continued)

OTHER PUBLICATIONS

International Search Report for PCT/JP2015/073609 dated Nov. 24, 2015.
(Continued)

*Primary Examiner* — Robert S Loewe
(74) *Attorney, Agent, or Firm* — Birch, Stewart, Kolasch & Birch, LLP

(57) ABSTRACT

The present invention is a curable composition comprising a component (A), a component (B), a component (C), and a component (D), the curable composition comprising the component (A) and the component (B) in a mass ratio (component (A):component (B)) of 100:0.3 to 100:20, the component (A) being a silane compound (co)polymer that is represented by a formula (a-1) or a formula (a-2), $$(CHR^1X^0\text{-}D\text{-}SiO_{3/2})_m(R^2SiO_{3/2})_n(CHR^1X^0\text{-}D\text{-}SiZ^1O_{2/2})_o(R^2SiZ^2O_{2/2})_p(CHR^1X^0\text{-}D\text{-}SiZ^3{}_2O_{1/2})_q(R^2SiZ^4{}_2O_{1/2})_r \quad \text{(a-1)}$$

$$(R^3SiO_{3/2})_s(R^3SiZ^5O_{2/2})_t(R^3SiZ^5{}_2O_{1/2})_u \quad \text{(a-2)}$$

the component (B) being fine particles having an average primary particle size of more than 0.04 μm and 8 μm or less, the component (C) being a silane coupling agent that comprises a nitrogen atom in its molecule, and the component (D) being a silane coupling agent that comprises an acid anhydride structure in its molecule, and an optical element-securing composition, and
a cured product, and
an optical element-securing material, and
a method for using the curable composition, and
an optical device.

14 Claims, No Drawings

(51) Int. Cl.
*C09J 183/04* (2006.01)
*C08L 83/06* (2006.01)
*C08G 77/16* (2006.01)
*C08G 77/18* (2006.01)

(56) References Cited

U.S. PATENT DOCUMENTS

| | | | |
|---|---|---|---|
| 2005/0238879 A1* | 10/2005 | Shoshi | G02F 1/135 428/412 |
| 2008/0292711 A1* | 11/2008 | Berg-Schultz | A61K 8/0241 424/497 |
| 2009/0008673 A1 | 1/2009 | Kato et al. | |
| 2009/0148693 A1 | 6/2009 | Kumagai | |
| 2011/0034659 A1 | 2/2011 | Kashio et al. | |
| 2011/0054139 A1 | 3/2011 | Kashio et al. | |
| 2012/0319153 A1* | 12/2012 | Matsuda | B29C 43/18 257/98 |
| 2013/0092973 A1* | 4/2013 | Kondo | C08L 83/04 257/100 |
| 2013/0092974 A1* | 4/2013 | Kimura | H01L 33/52 257/100 |
| 2015/0065663 A1 | 3/2015 | Matsui et al. | |

FOREIGN PATENT DOCUMENTS

| | | |
|---|---|---|
| JP | 2004-359933 A | 12/2004 |
| JP | 2005-263869 A | 9/2005 |
| JP | 2006-328231 A | 12/2006 |
| JP | 2007-507583 A | 3/2007 |
| JP | 2007-112975 A | 5/2007 |
| JP | 2009-138059 A | 6/2009 |
| JP | 2011-173738 A | 9/2011 |
| JP | 5725479 B2 | 5/2015 |
| WO | WO 2009/101753 A1 | 8/2009 |
| WO | WO 2009/104505 A1 | 8/2009 |
| WO | WO 2011/111667 A1 | 9/2011 |
| WO | WO 2013/141360 A1 | 9/2013 |
| WO | WO 2013/186689 A1 | 12/2013 |
| WO | WO 2014/069508 A1 | 5/2014 |

OTHER PUBLICATIONS

Written Opinion of the International Searching Authority for PCT/JP2015/073609 (PCT/ISA/237) dated Nov. 24, 2015.
International Preliminary Report on Patentability and English translation of Written Opinion dated Feb. 28, 2017, in PCT International Application No. PCT/JP2015/073609.
Office Action dated Dec. 29, 2018, in Chinese Patent Application No. 201580045749.0, with English translation.

* cited by examiner

CURABLE COMPOSITION, CURED PRODUCT, METHOD FOR USING CURABLE COMPOSITION, AND OPTICAL DEVICE

TECHNICAL FIELD

The present invention relates to a curable composition that produces a cured product that exhibits excellent delamination resistance, excellent heat resistance, and high adhesion, a cured product obtained by curing the curable composition, a method for using the curable composition as an optical element adhesive or an optical element sealing material, and an optical device.

BACKGROUND ART

A curable composition has been improved in various ways taking account of the application, and is widely used as a raw material, an adhesive, a coating material, and the like that are used to produce optical parts and formed articles.

A curable composition also has attracted attention as an optical element-securing composition (e.g., optical element adhesive and optical element sealing material) that is used when producing a sealed optical element.

Examples of the optical element include a light-emitting element (e.g., laser (e.g., semiconductor laser diode (LD)) and light-emitting diode (LED)), a light-receiving element, a hybrid optical element, an optical integrated circuit, and the like. In recent years, an optical element that emits blue or white light (i.e., an optical element having a shorter emission peak wavelength) has been developed, and is widely used. There is a tendency that a light-emitting element having a short emission peak wavelength is significantly increased in brightness, and the amount of heat generated by such an optical element further increases.

Along with a recent increase in the brightness of an optical element, a cured product of an optical element-securing composition may deteriorate due to long-term exposure to high-energy light or high-temperature heat generated by such an optical element, whereby delamination or a decrease in adhesion may occur.

In order to solve the above problem, Patent Literature 1 to 3 propose an optical device-securing composition that includes a polysilsesquioxane compound as the main component, and Patent Literature 4 proposes a semiconductor light-emitting device member and the like that utilize a hydrolysis-polycondensation product of a silane compound.

However, the compositions and the cured product (e.g., member) disclosed in Patent Literature 1 to 4 may not exhibit sufficient delamination resistance and heat resistance while maintaining sufficient adhesion.

Therefore, development of a curable composition that produces a cured product that exhibits excellent delamination resistance, excellent heat resistance, and high adhesion has been desired.

CITATION LIST

Patent Literature

Patent Literature 1: JP-A-2004-359933
Patent Literature 2: JP-A-2005-263869
Patent Literature 3: JP-A-2006-328231
Patent Literature 4: JP-A-2007-112975 (US2009008673A1)

SUMMARY OF INVENTION

Technical Problem

The invention was conceived in view of the above situation. An object of the invention is to provide a curable composition that produces a cured product that exhibits excellent delamination resistance and excellent heat resistance, a cured product obtained by curing the curable composition, a method for using the curable composition as an optical element adhesive or an optical element sealing material, and an optical device.

Solution to Problem

The inventors conducted extensive studies in order to solve the above problem. As a result, the inventors found that a composition that includes a specific silane compound (co)polymer, fine particles, and a silane coupling agent in a specific ratio produces a cured product that exhibits excellent delamination resistance, excellent heat resistance, and high adhesion. This finding has led to the completion of the invention.

Several aspects of the invention provide the following curable composition (see (1) to (9)), cured product (see (10) and (11)), method for using a curable composition (see (12) and (13)), and optical device (see (14)).

(1) A curable composition including a component (A), a component (B), a component (C), and a component (D), the curable composition including the component (A) and the component (B) in a mass ratio (component (A):component (B)) of 100:0.3 to 100:20, the component (A) being a silane compound (co)polymer that is represented by a formula (a-1) or a formula (a-2),

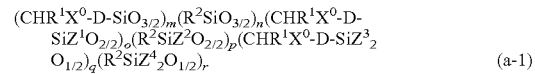

(a-1)

wherein $X^0$ is a halogen atom, a cyano group, or a group represented by OG (wherein G is a protecting group for a hydroxy group), D is a single bond, or a substituted or unsubstituted divalent organic group having 1 to 20 carbon atoms, $R^1$ is a hydrogen atom or an alkyl group having 1 to 6 carbon atoms, $R^2$ is an alkyl group having 1 to 20 carbon atoms, or a substituted or unsubstituted phenyl group, $Z^1$ to $Z^4$ are independently a hydroxy group, an alkoxy group having 1 to 10 carbon atoms, or a halogen atom, m and n are independently a positive integer, and o, p, q, and r are independently 0 or a positive integer, $$(R^3SiO_{3/2})_s(R^3SiZ^5O_{2/2})_t(R^3SiZ^5{}_2O_{1/2})_u \qquad (a-2)$$

wherein $R^3$ is an alkyl group having 1 to 10 carbon atoms, provided that a plurality of $R^3$ are either identical to or different from each other when a plurality of $R^3$ are present, $Z^5$ is a hydroxy group, an alkoxy group having 1 to 10 carbon atoms, or a halogen atom, s is a positive integer, and t and u are independently 0 or a positive integer, the component (B) being fine particles having an average primary particle size of more than 0.04 μm and 8 μm or less, the component (C) being a silane coupling agent that includes a nitrogen atom in its molecule, and the component (D) being a silane coupling agent that includes an acid anhydride structure in its molecule.

(2) The curable composition according to (1), wherein the component (B) is at least one type of fine particles selected from silica, a silicone, and a silicone-coated metal oxide.

(3) The curable composition according to (1), wherein the component (B) is fine particles of silicone-coated titanium oxide or aluminum oxide.
(4) The curable composition according to (1), wherein the component (A) has a mass average molecular weight of 800 to 30,000.
(5) The curable composition according to (1), wherein the component (A) is a compound represented by the formula (a-1) wherein the ratio ((m+o+q):(n+p+r)) of (m+o+q) to (n+p+r) is 5:95 to 60:40.
(6) The curable composition according to (1), further including a diluent.
(7) The curable composition according to (6), including the component (A), the component (B), the component (C), and the component (D) in a total ratio of 50 to 100 mass % based on the total amount of components included in the curable composition excluding the diluent.
(8) The curable composition according to (6), having a solid content of 50 to 100 mass %.
(9) The curable composition according to (1), the curable composition being an optical element-securing composition.
(10) A cured product obtained by curing the curable composition according to (1).
(11) The cured product according to (10), the cured product being an optical element-securing material.
(12) A method for using the curable composition according to (1) as an optical element-securing adhesive.
(13) A method for using the curable composition according to (1) as an optical element sealing material.
(14) An optical device produced using the curable composition according to (1) as an optical element-securing adhesive or an optical element sealing material.

Advantageous Effects of Invention

The curable composition according to one aspect of the invention thus produces a cured product that exhibits excellent delamination resistance, excellent heat resistance, and high adhesion.

The curable composition according to one aspect of the invention may be used to form an optical element-securing material, and may particularly suitably be used as an optical element adhesive and an optical element sealing material.

The cured product according to one aspect of the invention exhibits excellent delamination resistance, excellent heat resistance, and high adhesion.

DESCRIPTION OF EMBODIMENTS

A curable composition, a cured product, a method for using a curable composition, and an optical device according to the exemplary embodiments of the invention are described in detail below.

1) Curable Composition

A curable composition according to one embodiment of the invention includes a component (A), a component (B), a component (C), and a component (D), and includes the component (A) and the component (B) in a mass ratio (component (A):component (B)) of 100:0.3 to 100:20, the component (A) being a silane compound (co)polymer that is represented by the following formula (a-1) or the following formula (a-2),

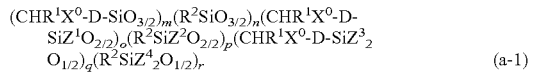

(a-1)

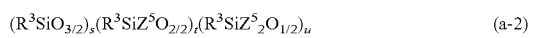

(a-2)

the component (B) being fine particles having an average primary particle size of more than 0.04 μm and 8 μm or less, the component (C) being a silane coupling agent that includes a nitrogen atom in its molecule, and the component (D) being a silane coupling agent that includes an acid anhydride structure in its molecule.

Component (A)

The component (A) included in the curable composition according to one embodiment of the invention is a silane compound copolymer (a-1) represented by the formula (a-1), or a silane compound (co)polymer (a-2) represented by the formula (a-2).

(i) Silane Compound Copolymer (a-1)

$X^0$ in the formula (a-1) is a halogen atom (e.g., fluorine atom, chlorine atom, bromine atom, or iodine atom), a cyano group, or a group represented by OG.

G is a protecting group for a hydroxy group. The protecting group for a hydroxy group is not particularly limited, and may be an arbitrary protecting group that is known as a protecting group for a hydroxy group. Examples of the protecting group include an acyl-based protecting group; a silyl-based protecting group such as a trimethylsilyl group, a triethylsilyl group, a t-butyldimethylsilyl group, and a t-butyldiphenylsilyl group; an acetal-based protecting group such as a methoxymethyl group, a methoxyethoxymethyl group, a 1-ethoxyethyl group, a tetrahydropyran-2-yl group, and a tetrahydrofuran-2-yl group; an alkoxycarbonyl-based protecting group such as a t-butoxycarbonyl group; an ether-based protecting group such as a methyl group, an ethyl group, a t-butyl group, an octyl group, an allyl group, a triphenylmethyl group, a benzyl group, a p-methoxybenzyl group, a fluorenyl group, a trityl group, and a benzhydryl group; and the like. It is preferable that G be an acyl-based protecting group.

The acyl-based protecting group is represented by —C(=O)$R^5$ (wherein $R^5$ is an alkyl group having 1 to 6 carbon atoms (e.g., methyl group, ethyl group, n-propyl group, isopropyl group, n-butyl group, isobutyl group, s-butyl group, t-butyl group, or n-pentyl group), or a substituted or unsubstituted phenyl group).

Examples of the substituent when $R^5$ is a substituted phenyl group, include an alkyl group such as a methyl group, an ethyl group, an n-propyl group, an isopropyl group, an n-butyl group, an s-butyl group, an isobutyl group, a t-butyl group, an n-pentyl group, an n-hexyl group, an n-heptyl group, an n-octyl group, and an isooctyl group; a halogen atom such as a fluorine atom, a chlorine atom, and a bromine atom; an alkoxy group such as a methoxy group and an ethoxy group; and the like.

It is preferable that $X^0$ be a chlorine atom or a group selected from a group represented by OG' (wherein G' is an acyl-based protecting group) and a cyano group, more preferably a chlorine atom or a group selected from an acetoxy group and a cyano group, and particularly preferably a cyano group, from the viewpoint of availability and a capability to produce a cured product that exhibits high adhesion.

D is a single bond, or a substituted or unsubstituted divalent organic group having 1 to 20 carbon atoms.

Examples of the divalent organic group having 1 to 20 carbon atoms include an alkylene group having 1 to 20 carbon atoms, an alkenylene group having 2 to 20 carbon atoms, an alkynylene group having 2 to 20 carbon atoms, an arylene group having 6 to 20 carbon atoms, a divalent group having 7 to 20 carbon atoms obtained by combining an alkylene group, an alkenylene group, or an alkynylene group with an arylene group, and the like.

Examples of the alkylene group having 1 to 20 carbon atoms include a methylene group, an ethylene group, a propylene group, a trimethylene group, a tetramethylene group, a pentamethylene group, a hexamethylene group, and the like.

Examples of the alkenylene group having 2 to 20 carbon atoms include a vinylene group, a propenylene group, a butenylene group, a pentenylene group, and the like.

Examples of the alkynylene group having 2 to 20 carbon atoms include an ethynylene group, a propynylene group, and the like.

Examples of the arylene group having 6 to 20 carbon atoms include an o-phenylene group, an m-phenylene group, a p-phenylene group, a 2,6-naphthylene group, and the like.

Examples of a substituent that may substitute the alkylene group having 1 to 20 carbon atoms, the alkenylene group having 2 to 20 carbon atoms, and the alkynylene group having 2 to 20 carbon atoms, include a halogen atom such as a fluorine atom and a chlorine atom; an alkoxy group such as a methoxy group and an ethoxy group; an alkylthio group such as a methylthio group and an ethylthio group; an alkoxycarbonyl group such as a methoxycarbonyl group and an ethoxycarbonyl group; and the like.

Examples of a substituent that may substitute the arylene group having 6 to 20 carbon atoms, include a cyano group; a nitro group; a halogen atom such as a fluorine atom, a chlorine atom, and a bromine atom; an alkyl group such as a methyl group and an ethyl group; an alkoxy group such as a methoxy group and an ethoxy group; an alkylthio group such as a methylthio group and an ethylthio group; and the like.

These substituents may be bonded to the alkylene group, the alkenylene group, the alkynylene group, and the arylene group at an arbitrary position. A plurality of identical or different substituents may be bonded to the alkylene group, the alkenylene group, the alkynylene group, and the arylene group.

Examples of the divalent group obtained by combining a substituted or unsubstituted alkylene group, a substituted or unsubstituted alkenylene group, or a substituted or unsubstituted alkynylene group with a substituted or unsubstituted arylene group, include a group in which at least one group among a substituted or unsubstituted alkylene group, a substituted or unsubstituted alkenylene group, and a substituted or unsubstituted alkynylene group, and at least one substituted or unsubstituted arylene group, are bonded linearly, and the like. Specific examples of the divalent group include the groups respectively represented by the following formulas, and the like.

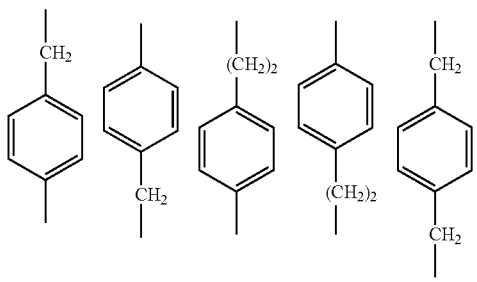

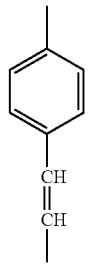

It is preferable that D be an alkylene group having 1 to 10 carbon atoms, more preferably an alkylene group having 1 to 6 carbon atoms, and particularly preferably a methylene group or an ethylene group, since a cured product that exhibits high adhesion can be obtained.

$R^1$ is a hydrogen atom or an alkyl group having 1 to 6 carbon atoms. Examples of the alkyl group having 1 to 6 carbon atoms that may be represented by $R^1$ include a methyl group, an ethyl group, an n-propyl group, an isopropyl group, an n-butyl group, an isobutyl group, an s-butyl group, a t-butyl group, an n-pentyl group, an n-hexyl group, and the like.

It is preferable that $R^1$ be a hydrogen atom.

$R^2$ is an alkyl group having 1 to 20 carbon atoms, or a substituted or unsubstituted phenyl group.

Examples of the alkyl group having 1 to 20 carbon atoms that may be represented by $R^2$ include a methyl group, an ethyl group, an n-propyl group, an isopropyl group, an n-butyl group, an s-butyl group, an isobutyl group, a t-butyl group, an n-pentyl group, an n-hexyl group, an n-octyl group, an isooctyl group, an n-nonyl group, an n-decyl group, an n-dodecyl group, and the like.

Examples of the substituent when $R^2$ is a substituted phenyl group, include an alkyl group such as a methyl group, an ethyl group, an n-propyl group, an isopropyl group, an n-butyl group, an s-butyl group, an isobutyl group, a t-butyl group, an n-pentyl group, an n-hexyl group, an n-heptyl group, an n-octyl group, and an isooctyl group; a halogen atom such as a fluorine atom, a chlorine atom, and a bromine atom; an alkoxy group such as a methoxy group and an ethoxy group; and the like.

Specific examples of the substituted or unsubstituted phenyl group that may be represented by $R^2$ include a phenyl group, a 2-chlorophenyl group, a 4-methylphenyl group, a 3-ethylphenyl group, a 2,4-dimethylphenyl group, a 2-methoxyphenyl group, and the like.

It is preferable that $R^2$ be an alkyl group having 1 to 6 carbon atoms, or a substituted or unsubstituted phenyl group, and particularly preferably an alkyl group having 1 to 6 carbon atoms, or a phenyl group.

$Z^1$ to $Z^4$ are independently a hydroxy group, an alkoxy group having 1 to 10 carbon atoms, or a halogen atom. Examples of the alkoxy group having 1 to 10 carbon atoms include a methoxy group, an ethoxy group, a propoxy group, an isopropoxy group, a butoxy group, a t-butoxy group, a pentyloxy group, a hexyloxy group, an octyloxy group, and the like. Examples of the halogen atom include a chlorine atom, a bromine atom, and the like.

It is preferable that $Z^1$ to $Z^4$ be independently a hydroxy group or an alkoxy group having 1 to 6 carbon atoms.

m and n are independently a positive integer. o, p, q, and r are independently 0 or a positive integer. It is preferable that (m+o+q) and (n+p+r) be positive integers that satisfy ($m+o+q$):($n+p+r$)=5:95 to 60:40, and more preferably 10:90 to 30:70, since the advantageous effects of the invention are more easily achieved.

The silane compound copolymer (a-1) may be produced using an arbitrary method. The silane compound copolymer (a-1) is preferably produced by condensing a silane compound (1) represented by a formula (1): $R^1$—CH($X^0$)-D-Si($OR^4$)$_v$($X^1$)$_{3-v}$, and a silane compound (2) represented by a formula (2): $R^2$Si($OR^5$)$_w$($X^2$)$_{3-w}$. Note that the term "condensation" is used herein in a broad sense, and includes hydrolysis and polycondensation (hereinafter the same).

$OR^4$ or $X^1$ included in the silane compound (1) remains in the silane compound copolymer (a-1) when $OR^4$ or $X^1$ is not subjected to dehydration and dealcoholization condensation. When one $OR^4$ or $X^1$ is not subjected to condensation, the one $OR^4$ or $X^1$ remains in the silane compound copolymer represented by the formula (a-1) as (CHR$^1$X$^0$-D-SiZ$^1$O$_{2/2}$). When two $OR^4$ or $X^1$ are not subjected to condensation, the two $OR^4$ or $X^1$ remain in the silane compound copolymer represented by the formula (a-1) as (CHR$^1$X$^0$-D-SiZ$^3_2$O$_{1/2}$).

Likewise, $OR^5$ or $X^2$ included in the silane compound (2) remains in the silane compound copolymer (a-1) when $OR^5$ or $X^2$ is not subjected to dehydration and dealcoholization condensation. When one $OR^5$ or $X^2$ is not subjected to condensation, the one $OR^5$ or $X^2$ remains in the silane compound copolymer represented by the formula (a-1) as ($R^2$SiZ$^2$O$_{2/2}$). When two $OR^5$ or $X^2$ are not subjected to condensation, the two $OR^5$ or $X^2$ remain in the silane compound copolymer represented by the formula (a-1) as ($R^2$SiZ$^4_2$O$_{1/2}$).

Silane Compound (1)

$R^1$, $X^0$, and D in the formula (1) are the same as defined above. $R^4$ is an alkyl group having 1 to 10 carbon atoms, $X^1$ is a halogen atom, and v is an integer from 0 to 3.

Examples of the alkyl group having 1 to 10 carbon atoms that is represented by $R^4$ include a methyl group, an ethyl group, an n-propyl group, an isopropyl group, an n-butyl group, an s-butyl group, an isobutyl group, a t-butyl group, an n-pentyl, an n-hexyl group, and the like.

Examples of the halogen atom that is represented by $X^1$ include a fluorine atom, a chlorine atom, a bromine atom, and the like.

When v is equal to or larger than 2, $OR^4$ may be either identical to or different from each other. When (3-v) is equal to or larger than 2, $X^1$ may be either identical to or different from each other.

Specific examples of the silane compound (1) include trialkoxysilane compounds in which $X^0$ is a halogen atom, such as chloromethyltrimethoxysilane, bromomethyltriethoxysilane, 2-chloroethyltripropoxysilane, 2-bromoethyltributoxysilane, 3-chloropropyltrimethoxysilane, 3-chloropropyltriethoxysilane, 3-chloropropyltripropoxysilane, 3-chloropropyltributoxysilane, 3-bromopropyltrimethoxysilane, 3-bromopropyltriethoxysilane, 3-bromopropyltripropoxysilane, 3-bromopropyltributoxysilane, 3-fluoropropyltrimethoxysilane, 3-fluoropropyltriethoxysilane, 3-fluoropropyltripropoxysilane, 3-fluoropropyltributoxysilane, 3-iodopropyltrimethoxysilane, 2-chloroethyltrimethoxysilane, 3-chloropropyltriethoxysilane, 4-chlorobutyltripropoxysilane, 5-chloropentyltripropoxysilane, 4-chlorobutylchlorodiethoxysilane, 2-chloropropyltrimethoxysilane, o-(2-chloroethyl)phenyltripropoxysilane, m-(2-chloroethyl)phenyltrimethoxysilane, p-(2-chloroethyl)phenyltriethoxysilane, and p-(2-fluoroethyl)phenyltrimethoxysilane; halogenodialkoxysilane compounds in which $X^0$ is a halogen atom, such as chloromethylchlorodimethoxysilane, bromomethylbromodimethoxysilane, 2-chloroethylchlorodimethoxysilane, 3-chloropropylchlorodimethoxysilane, 3-bromopropylchlorodimethoxysilane, 3-fluoropropylchlorodimethoxysilane, 3-fluoropropylchlorodiethoxysilane, and 3-chloro-n-butylchlorodiethoxysilane; dihalogenoalkoxysilane compounds in which $X^0$ is a halogen atom, such as 2-chloroethyldichloromethoxysilane, 2-bromoethyldichloroethoxysilane, 3-chloropropyldichloromethoxysilane, 3-fluoropropyldichloromethoxysilane, 3-chloropropyldichloroethoxysilane, 3-chloropropylchlorodiethoxysilane, and 3-bromopropyldichloroethoxysilane;

trihalogenosilane compounds in which $X^0$ is a halogen atom, such as chloromethyltrichlorosilane, 3-bromopropyltribromosilane, 3-bromopropyltrichlorosilane, 3-fluoropropyltrichlorosilane, 3-chloropropyltrichlorosilane, 3-chloropropyltribromosilane, and 3-iodopropyltrichlorosilane;

trialkoxysilane compounds in which $X^0$ is a cyano group, such as cyanomethyltrimethoxysilane, cyanomethyltriethoxysilane, 1-cyanoethyltrimethoxysilane, 2-cyanoethyltrimethoxysilane, 2-cyanoethyltriethoxysilane, 2-cyanoethyltripropoxysilane, 3-cyanopropyltrimethoxysilane, 3-cyanopropyltriethoxysilane, 3-cyanopropyltripropoxysilane, 3-cyanopropyltributoxysilane, 4-cyanobutyltrimethoxysilane, 5-cyanopentyltrimethoxysilane, 2-cyanopropyltrimethoxysilane, 2-(cyanomethoxy)ethyltrimethoxysilane, 2-(2-cyanoethoxy)ethyltrimethoxysilane, o-(cyanomethyl)phenyltripropoxysilane, m-(cyanomethyl)phenyltrimethoxysilane, p-(cyanomethyl)phenyltriethoxysilane, and p-(2-cyanoethyl)phenyltrimethoxysilane;

halogenosilane compounds in which $X^0$ is a cyano group, such as cyanomethyltrichlorosilane, cyanomethylbromodimethoxysilane, 2-cyanoethyldichloromethoxysilane, 2-cyanoethyldichloroethoxysilane, 3-cyanopropyltrichlorosilane, 3-cyanopropyltribromosilane, 3-cyanopropyldichloromethoxysilane, 3-cyanopropyldichloroethoxysilane, 3-cyanopropylchlorodimethoxysilane, 3-cyanopropylchlorodiethoxysilane, 4-cyanobutylchlorodiethoxysilane, 3-cyano-n-butylchlorodiethoxysilane, 2-(2-cyanoethoxy)ethyltrichlorosilane, 2-(2-cyanoethoxy)ethylbromodiethoxysilane, 2-(2-cyanoethoxy)ethyldichloropropoxysilane, o-(2-cyanoethyl)phenyltrichlorosilane, m-(2-cyanoethyl)phenylmethoxydibromosilane, p-(2-cyanoethyl)phenyldimethoxychlorosilane, and p-(2-cyanoethyl)phenyltribromosilane;

trialkoxysilane compounds in which $X^0$ is the group represented by OG, such as 3-acetoxypropyltrimethoxysilane, 3-acetoxypropyltriethoxysilane, 3-acetoxypropyltripropoxysilane, 3-acetoxypropyltributoxysilane, 3-propionyloxypropyltrimethoxysilane, 3-propionyloxypropyltriethoxysilane, 3-benzoyloxypropyltrimethoxysilane, 3-benzoyloxypropyltriethoxysilane, 3-benzoyloxypropyltripropoxysilane, 3-benzoyloxypropyltributoxysilane, 2-trimethylsilyloxyethyltrimethoxysilane, 3-triethylsilyloxypropyltriethoxysilane, 3-(2-tetrahydropyranyloxy)propyltripropoxysilane, 3-(2-tetrahydrofuranyloxy)propyltributoxysilane, 3-methoxymethyloxypropyltrimethoxysilane, 3-methoxyethoxymethyloxypropyltriethoxysilane, 3-(1-ethoxyethyloxy)propyltripropoxysilane, 3-(t-butoxycarbonyloxy)propyltrimethoxysilane, 3-t-butoxypropyltrimethoxysilane, 3-benzyloxypropyltriethoxysilane, and 3-triphenylmethoxypropyltriethoxysilane;

halogenosilane compounds in which $X^0$ is the group represented by OG, such as 3-acetoxypropyltrichlorosilane, 3-acetoxypropyltribromosilane, 3-acetoxypropyldichloromethoxysilane, 3-acetoxypropyldichloroethoxysilane, 3-acetoxypropylchlorodimethoxysilane, 3-acetoxypropylchlorodiethoxysilane, 3-benzoyloxypropyltrichlorosilane, 3-trimethylsilyloxypropylchlorodimethoxysilane, 3-triethylsilyloxypropyldichloromethoxysilane, 3-(2-tetrahydropyranyloxy)propylchlorodiethoxysilane, 3-(2-tetrahydrofuranyloxy)propyldichloroethoxysilane, 3-methoxymethyloxypropyltribromosilane, 3-methoxyethoxymethyloxypropyltrichlorosilane, 3-(1-ethoxyethyloxy)propylchlorodimethoxysilane, 3-t-butoxycarbonyloxypropyldichloromethoxysilane, 3-t-butoxypropylchlorodiethoxysilane, 3-triphenylmethoxypropyldichloroethoxysilane, and 3-benzyloxypropyltribromosilane; and the like.

These silane compounds (1) may be used either alone or in combination.

It is preferable that the silane compound (1) be trialkoxysilane compounds, more preferably trialkoxysilane compounds that includes a 3-chloropropyl group, trialkoxysilane compounds that includes a 3-acetoxypropyl group, trialkoxysilane compounds that includes a 2-cyanoethyl group, or trialkoxysilane compounds that includes a 3-cyanopropyl group, and particularly preferably trialkoxysilane compounds that includes a 2-cyanoethyl group, since a cured product that exhibits better adhesion can be obtained.

Silane Compound (2)

$R^2$ in the formula (2) is the same as defined above. $R^5$ is an alkyl group having 1 to 10 carbon atoms, such as those mentioned above in connection with $R^4$, $X^2$ is a halogen atom, such as those mentioned above in connection with $X^1$, and w is an integer from 0 to 3.

When w is equal to or larger than 2, $OR^5$ may be either identical to or different from each other. When (3-w) is equal to or larger than 2, $X^2$ may be either identical to or different from each other.

Specific examples of the silane compound (2) include alkyltrialkoxysilane compounds such as methyltrimethoxysilane, methyltriethoxysilane, ethyltrimethoxysilane, ethyltriethoxysilane, n-propyltrimethoxysilane, n-butyltriethoxysilane, i-butyltrimethoxysilane, n-pentyltriethoxysilane, n-hexyltrimethoxysilane, i-octyltriethoxysilane, dodecyltrimethoxysilane, methyldimethoxyethoxysilane, and methyldiethoxymethoxysilane; an alkylhalogenoalkoxysilane compound such as methylchlorodimethoxysilane, methyldichloromethoxysilane, methyldichloromethoxysilane, methylchlorodiethoxysilane, ethylchlorodimethoxysilane, ethyldichloromethoxysilane, n-propylchlorodimethoxysilane, and n-propyldichloromethoxysilane; an alkyltrihalogenosilane compound such as methyltrichlorosilane, methyltribromosilane, ethyltrichlorosilane, ethyltribromosilane, and n-propyltrichlorosilane;
substituted or unsubstituted phenyltrialkoxysilane compounds such as phenyltrimethoxysilane, 4-methoxyphenyltrimethoxysilane, 2-chlorophenyltrimethoxysilane, phenyltriethoxysilane, 2-methoxyphenyltriethoxysilane, phenyldimethoxyethoxysilane, and phenyldiethoxymethoxysilane; substituted or unsubstituted phenylhalogenoalkoxysilane compounds such as phenylchlorodimethoxysilane, phenyldichloromethoxysilane, phenylchloromethoxyethoxysilane, phenylchlorodiethoxysilane, and phenyldichloroethoxysilane; and
a substituted or unsubstituted phenyltrihalogenosilane compound such as phenyltrichlorosilane, phenyltribromosilane, 4-methoxyphenyltrichlorosilane, 2-ethoxyphenyltrichlorosilane, and 2-chlorophenyltrichlorosilane.

These silane compounds (2) may be used either alone or in combination.

It is preferable that the silane compound (2) be $C_{1-6}$ alkyltrialkoxysilane compounds or substituted or unsubstituted phenyltrialkoxysilane compounds.

The silane compound (1) and the silane compound (2) are preferably used in a molar ratio (silane compound (1):silane compound (2)) of 60:40 to 5:95, and more preferably 40:60 to 10:90.

The silane compound (1) and the silane compound (2) may be condensed using an arbitrary method. For example, the silane compound (1) and the silane compound (2) may be condensed by dissolving the silane compound (1) and the silane compound (2) in a solvent, adding a specific amount of catalyst to the solution, and stirring the mixture at a specific temperature.

An acid catalyst or a base catalyst may be used as the catalyst.

An acid catalyst and a base catalyst may be used in combination as the catalyst. For example, the silane compound (1) and the silane compound (2) may be condensed in the presence of an acid catalyst, a base catalyst may be added to the reaction mixture so that the mixture becomes basic, and a condensation reaction may be further effected under basic conditions.

Examples of the acid catalyst include an inorganic acid such as hydrochloric acid, sulfuric acid, nitric acid, and phosphoric acid; an organic acid such as methanesulfonic acid, trifluoromethanesulfonic acid, benzenesulfonic acid, p-toluenesulfonic acid, acetic acid, and trifluoroacetic acid; and the like.

Examples of the base catalyst include aqueous ammonia; an organic base such as trimethylamine, triethylamine, lithium diisopropylamide, lithium bis(trimethylsilyl)amide, pyridine, 1,8-diazabicyclo[5.4.0]-7-undecene, aniline, picoline, 1,4-diazabicyclo[2.2.2]octane, and imidazole; a quaternary ammonium salt hydroxide such as tetramethylammonium hydroxide and tetraethylammonium hydroxide; a metal alkoxide such as sodium methoxide, sodium ethoxide, sodium t-butoxide, and potassium t-butoxide; a metal hydride such as sodium hydride and calcium hydride; a metal hydroxide such as sodium hydroxide, potassium hydroxide, and calcium hydroxide; a metal carbonate such as sodium carbonate, potassium carbonate, and magnesium carbonate; a metal hydrogen carbonate such as sodium hydrogen carbonate and potassium hydrogen carbonate; and the like.

The catalyst is normally used in a ratio of 0.1 to 10 mol %, and preferably 1 to 5 mol %, based on the total number of moles of the silane compounds.

A solvent may optionally be used when condensing the silane compound (1) and the silane compound (2). The solvent may be appropriately selected taking account of the type of each silane compound and the like. Examples of the solvent include water; aromatic hydrocarbons such as benzene, toluene, and xylene; esters such as methyl acetate, ethyl acetate, propyl acetate, butyl acetate, and methyl propionate; ketones such as acetone, methyl ethyl ketone, methyl i-butyl ketone, and cyclohexanone; alcohols such as methyl alcohol, ethyl alcohol, n-propyl alcohol, i-propyl alcohol, n-butyl alcohol, i-butyl alcohol, s-butyl alcohol, and t-butyl alcohol; and the like. These solvents may be used either alone or in combination.

The solvent is normally used so that the total number of moles of the silane compounds is 0.1 to 10 mol, and preferably 0.5 to 10 mol, per liter of the solvent.

The silane compounds are normally condensed (reacted) in a temperature range from 0° C. to the boiling point of the solvent, and preferably 20 to 100° C. If the reaction temperature is too low, condensation may not proceed sufficiently. If the reaction temperature is too high, it may be difficult to suppress gelation. The reaction normally ends within 30 minutes to 20 hours.

After completion of the reaction, the reaction solution is neutralized by adding an aqueous solution including an alkali (e.g., sodium hydrogen carbonate) to the reaction solution when the acid catalyst is used, or neutralized by adding an acid (e.g., hydrochloric acid) to the reaction solution when the base catalyst is used. Salts produced during neutralization are removed by filtration, washing with water, or the like to obtain the desired silane compound (co)polymer.

(ii) Silane Compound (Co)Polymer (a-2)

$R^3$ in the formula (a-2) is an alkyl group having 1 to 10 carbon atoms. Examples of the alkyl group having 1 to 10 carbon atoms include a methyl group, an ethyl group, an n-propyl group, an isopropyl group, an n-butyl group, an isobutyl group, an s-butyl group, a t-butyl group, an n-pentyl group, an n-hexyl group, an n-octyl group, an n-nonyl group, and the like. Among these, an alkyl group having 1 to 6 carbon atoms is preferable, and an alkyl group having 1 to 3 carbon atoms is more preferable. A plurality of $R^3$ may be either identical to or different from each other when a plurality of $R^3$ are present.

$Z^5$ is a hydroxy group, an alkoxy group having 1 to 10 carbon atoms, or a halogen atom, such as those mentioned above in connection with $Z^1$ to $Z^4$.

s is a positive integer, and t and u are independently 0 or a positive integer.

The silane compound (co)polymer (a-2) may be produced using an arbitrary method. For example, the silane compound (co)polymer (a-2) may be produced by condensing a silane compound (3) represented by a formula (3): $R^3Si(OR^6)_x(X^3)_{3-x}$ in the same manner as described above in connection with the production of the silane compound copolymer (a-1).

Silane Compound (3)

$R^3$ in the formula (3) is the same as defined above. $R^6$ is an alkyl group having 1 to 10 carbon atoms, such as those mentioned above in connection with $R^4$, $X^3$ is a halogen atom, such as those mentioned above in connection with $X^1$, and x is an integer from 0 to 3.

When x is equal to or larger than 2, $OR^6$ may be either identical to or different from each other. When (3-x) is equal to or larger than 2, $X^3$ may be either identical to or different from each other.

Specific examples of the silane compound (3) include alkyltrialkoxysilane compounds such as methyltrimethoxysilane, methyltriethoxysilane, ethyltrimethoxysilane, ethyltriethoxysilane, ethyltripropoxysilane, n-propyltrimethoxysilane, n-propyltriethoxysilane, n-propyltripropoxysilane, n-propyltributoxysilane, n-butyltrimethoxysilane, isobutyltrimethoxysilane, n-pentyltrimethoxysilane, n-hexyltrimethoxysilane, and isooctyltriethoxysilane;
alkylhalogenoalkoxysilane compounds such as methylchlorodimethoxysilane, methylchlorodiethoxysilane, methyldichloromethoxysilane, methylbromodimethoxysilane, ethylchlorodimethoxysilane, ethylchlorodiethoxysilane, ethyldichloromethoxysilane, ethylbromodimethoxysilane, n-propylchlorodimethoxysilane, n-propyldichloromethoxysilane, n-butylchlorodimethoxysilane, and n-butyldichloromethoxysilane;
alkyltrihalogenosilane compounds such as methyltrichlorosilane, methyltribromosilane, ethyltrichlorosilane, ethyltribromosilane, n-propyltrichlorosilane, n-propyltribromosilane, n-butyltrichlorosilane, isobutyltrichlorosilane, n-pentyltrichlorosilane, n-hexyltrichlorosilane, and isooctyltrichlorosilane; and the like.

These silane compounds (3) may be used either alone or in combination.

When the silane compound (co)polymer (A) (silane compound copolymer (a-1) or silane compound (co)polymer (a-2)) is a copolymer, the silane compound (co)polymer (A) may be a random copolymer, a block copolymer, a graft copolymer, an alternating copolymer, or the like. The silane compound (co)polymer (A) may have a ladder-like structure, a double decker-like structure, a basket-like structure, a partially cleaved basket-like structure, a cyclic structure, or a random structure.

The mass average molecular weight (Mw) of the silane compound copolymer (a-1) is normally 800 to 30,000, preferably 1,000 to 2,500, and more preferably 1,200 to 2,000. The mass average molecular weight (Mw) of the silane compound (co)polymer (a-2) is normally 800 to 50,000, preferably 3,000 to 30,000, and more preferably 5,000 to 15,000. When the weight average molecular weight (Mw) is within the above range, the resulting composition exhibits an excellent handling capability, and produces a cured product that exhibits excellent adhesion and excellent heat resistance.

The molecular weight distribution (Mw/Mn) of the silane compound (co)polymer (A) is not particularly limited. The molecular weight distribution (Mw/Mn) of the silane compound copolymer (a-1) is normally 1.0 to 3.0, and preferably 1.1 to 2.0. The molecular weight distribution (Mw/Mn) of the silane compound (co)polymer (a-2) is normally 1.0 to 10.0, and preferably 1.1 to 6.0. When the molecular weight distribution (Mw/Mn) is within the above range, a cured product that exhibits excellent adhesion and excellent heat resistance can be obtained.

The mass average molecular weight (Mw) and the number average molecular weight (Mn) refer to standard polystyrene-equivalent values determined by gel permeation chromatography (GPC) (eluent: tetrahydrofuran (THF)), for example (hereinafter the same).

The silane compound (co)polymers (A) described above may be used either alone or in combination.

Component (B)

The curable composition according to one embodiment of the invention includes fine particles having an average primary particle size of more than 0.04 μm and 8 μm or less, as the component (B).

The fine particles are not particularly limited. Examples of the fine particles include inorganic fine particles such as a metal, a metal oxide, a mineral, a metal carbonate such as calcium carbonate and magnesium carbonate, a metal sulfate such as calcium sulfate and barium sulfate, a metal hydroxide such as aluminum hydroxide, a metal silicate such as aluminum silicate, calcium silicate, and magnesium silicate, silica, a silicone, and a silicone-coated metal oxide; organic fine particles such as acrylic beads; and the like.

The term "metal" used herein refers to the elements that respectively belong to Group 1 (excluding H), Groups 2 to 11, Group 12 (excluding Hg), Group 13 (excluding B), Group 14 (excluding C and Si), Group 15 (excluding N, P, As, and Sb), and Group 16 (excluding O, S, Se, Te, and Po) in the periodic table.

The silica may be dry silica, wet silica, organically modified silica, or a mixture that includes two or more types of silica among dry silica, wet silica, and organically modified silica.

Examples of the metal oxide include titanium oxide, alumina, boehmite, chromium oxide, nickel oxide, copper oxide, titanium oxide, zirconium oxide, indium oxide, zinc oxide, a complex oxide thereof, and the like. The metal oxide fine particles may be sol particles of these metal oxides.

Examples of the mineral include a smectite, a bentonite, and the like.

Examples of the smectite include montmorillonite, beidellite, hectorite, saponite, stevensite, nontronite, sauconite, and the like.

Among these, fine particles of silica, a silicone, a metal oxide, and a silicone-coated metal oxide are preferable, fine particles of silica, a silicone, and a silicone-coated metal oxide are more preferable, and fine particles of silicone-coated titanium oxide or aluminum oxide are particularly preferable, since the object of the invention is easily achieved.

The fine particles may have a spherical shape, a chain-like shape, a needle-like shape, a plate-like shape, a flaky shape, a rod-like shape, a fibrous shape, or the like. It is preferable that the fine particles have a spherical shape. The term "spherical shape" used herein refers to a spherical shape, and an approximately spherical shape including a polyhedral shape that can be approximated to a sphere, such as a spheroidal shape, an oval shape, a konpeito-like shape, and a cocoon-like shape.

The average primary particle size of the fine particles is more than 0.04 μm and 8 μm or less. When the average primary particle size of the fine particles is more than 0.04 μm, the addition of the fine particles achieves a satisfactory effect. When the average primary particle size of the fine particles is 8 μm or less, the resulting curable composition exhibits excellent dispersibility.

The average primary particle size of the fine particles is more preferably 0.06 to 7 μm, still more preferably 0.3 to 6 μm, and particularly preferably 1 to 4 μm, from the viewpoint of achieving delamination resistance and dispersibility in combination.

The average primary particle size is determined by measuring the particle size distribution in accordance with a laser scattering method using a laser diffraction/scattering particle size distribution analyzer (e.g., "LA-920" manufactured by Horiba Ltd.).

The fine particles described above may be used in combination.

The component (B) is used in such an amount that the curable composition includes the component (A) and the component (B) in a mass ratio (component (A):component (B)) of 100:0.3 to 100:20, preferably 100:0.5 to 100:15, and more preferably 100:0.8 to 100:12. If the component (B) is used in such an amount that the curable composition includes the component (A) and the component (B) in a mass ratio that is less than the above range, the desired delamination resistance may not be obtained. If the component (B) is used in such an amount that the curable composition includes the component (A) and the component (B) in a mass ratio that exceeds the above range, a decrease in adhesion may occur.

Component (C)

The curable composition according to one embodiment of the invention includes a silane coupling agent that includes a nitrogen atom in its molecule (hereinafter may be referred to as "silane coupling agent (C)"), as the component (C).

The silane coupling agent (C) is not particularly limited as long as the silane coupling agent (C) includes a nitrogen atom in its molecule. Examples of the silane coupling agent (C) include a trialkoxysilane compound represented by the following formula (c-1), a dialkoxyalkylsilane compound or a dialkoxyarylsilane compound represented by the following formula (c-2), and the like.

(c-1)

(c-1)

$R^a$ in the formulas (c-1) and (c-2) is an alkoxy group having 1 to 6 carbon atoms, such as a methoxy group, an ethoxy group, an n-propoxy group, an isopropoxy group, an n-butoxy group, or a t-butoxy group. A plurality of $R^a$ may be either identical to or different from each other.

$R^b$ is an alkyl group having 1 to 6 carbon atoms, such as a methyl group, an ethyl group, an n-propyl group, an isopropyl group, an n-butyl group, or a t-butyl group, or a substituted or unsubstituted aryl group such as a phenyl group, a 4-chlorophenyl group, or a 4-methylphenyl group.

$R^c$ is an organic group having 1 to 10 carbon atoms that includes a nitrogen atom. $R^c$ may be bonded to a group that includes a silicon atom.

Specific examples of the organic group having 1 to 10 carbon atoms that is represented by $R^c$ include an N-2-(aminoethyl)-3-aminopropyl group, a 3-aminopropyl group, an N-(1,3-dimethylbutylidene)aminopropyl group, a 3-ureidopropyltriethoxysilane group, an N-phenylaminopropyl group, and the like.

Examples of the compound represented by the formula (c-1) or (c-2) in which $R^c$ is an organic group that is further bonded to a group that includes a silicon atom, include a compound in which $R^c$ is further bonded to a group that includes a silicon atom through an isocyanurate skeleton to form an isocyanurate-based silane coupling agent, and a compound in which $R^c$ is further bonded to a group that includes a silicon atom through a urea skeleton to form a urea-based silane coupling agent.

The silane coupling agent (C) is preferably an isocyanurate-based silane coupling agent or a urea-based silane coupling agent, and more preferably an isocyanurate-based silane coupling agent or a urea-based silane coupling agent that includes four or more alkoxy groups bonded to a silicon atom in the molecule, from the viewpoint of a capability to produce a cured product that exhibits higher adhesion.

The expression "includes four or more alkoxy groups bonded to a silicon atom" used herein means that the total number of alkoxy groups bonded to an identical silicon atom and alkoxy groups bonded to different silicon atoms is equal to or larger than 4.

Examples of the isocyanurate-based silane coupling agent that includes four or more alkoxy groups bonded to a silicon atom include a compound represented by the following formula (c-3). Examples of the urea-based silane coupling agent that includes four or more alkoxy groups bonded to a silicon atom include a compound represented by the following formula (c-4).

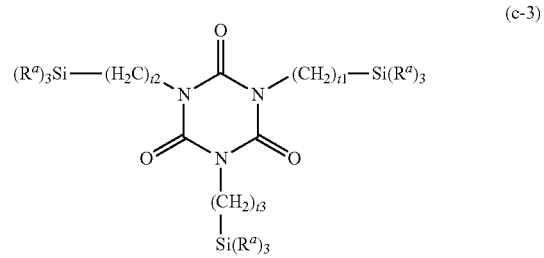

(c-3)

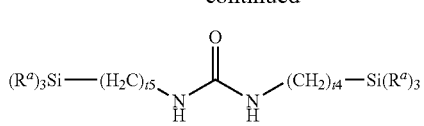

(c-4)

$R^a$ in the formulas (c-3) and (c-4) is the same as defined above.

t1 to t5 are independently an integer from 1 to 10, preferably an integer from 1 to 6, and particularly preferably 3.

Specific examples of the compound represented by the formula (c-3) include
a 1,3,5-N-tris[(tri($C_{1-6}$)alkoxy)silyl($C_{1-10}$)alkyl] isocyanurate such as 1,3,5-N-tris(3-trimethoxysilylpropyl) isocyanurate, 1,3,5-N-tris(3-triethoxysilylpropyl) isocyanurate, 1,3,5-N-tris(3-tri-i-propoxysilylpropyl) isocyanurate, and 1,3,5-N-tris(3-tributoxysilylpropyl) isocyanurate;
a 1,3,5-N-tris[(di($C_{1-6}$)alkoxy)silyl($C_{1-10}$)alkyl] isocyanurate such as 1,3,5-N-tris(3-dimethoxymethylsilylpropyl) isocyanurate, 1,3,5-N-tris(3-dimethoxyethylsilylpropyl) isocyanurate, 1,3,5-N-tris(3-dimethoxy-i-propylsilylpropyl) isocyanurate, 1,3,5-N-tris(3-dimethoxy-n-propylsilylpropyl) isocyanurate, 1,3,5-N-tris(3-dimethoxyphenylsilylpropyl) isocyanurate, 1,3,5-N-tris(3-diethoxymethylsilylpropyl) isocyanurate, 1,3,5-N-tris(3-diethoxyethylsilylpropyl) isocyanurate, 1,3,5-N-tris(3-diethoxy-i-propylsilylpropyl) isocyanurate, 1,3,5-N-tris(3-diethoxy-n-propylsilylpropyl) isocyanurate, 1,3,5-N-tris(3-diethoxyphenylsilylpropyl) isocyanurate, 1,3,5-N-tris(3-di-i-propoxymethylsilylpropyl) isocyanurate, 1,3,5-N-tris(3-di-i-propoxyethylsilylpropyl) isocyanurate, 1,3,5-N-tris(3-di-i-propoxy-i-propylsilylpropyl) isocyanurate, 1,3,5-N-tris(3-di-i-propoxy-n-propylsilylpropyl) isocyanurate, 1,3,5-N-tris(3-di-i-propoxyphenylsilylpropyl) isocyanurate, 1,3,5-N-tris(3-dibutoxymethylsilylpropyl) isocyanurate, 1,3,5-N-tris(3-dibutoxyethylsilylpropyl) isocyanurate, 1,3,5-N-tris(3-dibutoxy-i-propylsilylpropyl) isocyanurate, 1,3,5-N-tris(3-dibutoxy-n-propylsilylpropyl) isocyanurate, and 1,3,5-N-tris(3-dibutoxyphenylsilylpropyl) isocyanurate; and the like.

Specific examples of the compound represented by the formula (c-4) include
an N,N'-bis[(tri($C_{1-6}$)alkoxysilyl)($C_{1-10}$)alkyl]urea such as N,N'-bis(3-trimethoxysilylpropyl)urea, N,N'-bis(3-triethoxysilylpropyl)urea, N,N'-bis(3-tripropoxysilylpropyl)urea, N,N'-bis(3-tributoxysilylpropyl)urea, and N,N'-bis(2-trimethoxysilylethyl)urea;
an N,N'-bis[(di($C_{1-6}$)alkoxy($C_{1-6}$)alkylsilyl($C_{1-10}$)alkyl]urea such as N,N'-bis(3-dimethoxymethylsilylpropyl)urea, N,N'-bis(3-dimethoxyethylsilylpropyl)urea, and N,N'-bis(3-diethoxymethylsilylpropyl)urea;
an N,N'-bis[(di($C_{1-6}$)alkoxy($C_{6-20}$)arylsilyl($C_{1-10}$)alkyl]urea such as N,N'-bis(3-dimethoxyphenylsilylpropyl)urea and N,N'-bis(3-diethoxyphenylsilylpropyl)urea; and the like.

These compounds may be used either alone or in combination.

It is preferable to use either or both of 1,3,5-N-tris(3-trimethoxysilylpropyl) isocyanurate and 1,3,5-N-tris(3-triethoxysilylpropyl) isocyanurate (hereinafter collectively referred to as "isocyanurate compound"), or either or both of N,N'-bis(3-trimethoxysilylpropyl)urea and N,N'-bis(3-triethoxysilylpropyl)urea (hereinafter collectively referred to as "urea compound"), or a combination of the isocyanurate compound and the urea compound, as the component (C).

When the isocyanurate compound and the urea compound are used in combination, the isocyanurate compound and the urea compound are preferably used in a mass ratio (isocyanurate compound:urea compound) of 100:1 to 100:200.

The isocyanurate compound is preferably used in a ratio of 35 parts by mass or less, and more preferably 25 parts by mass or less, based on 100 parts by mass of the component (A). This applies to a case where the isocyanurate compound is used alone, and a case where the isocyanurate compound is used in combination with the urea compound.

The urea compound is preferably used in a ratio of 20 parts by mass or less, and more preferably 15 parts by mass or less, based on 100 parts by mass of the component (A). This applies to a case where the urea compound is used alone, and a case where the urea compound is used in combination with the isocyanurate compound.

It is preferable that the curable composition according to one embodiment of the invention include the component (A) and the component (C) in a mass ratio (component (A):component (C)) of 100:0.3 to 100:40, more preferably 100:1 to 100:30, and still more preferably 100:3 to 100:25.

When the component (A) and the component (C) are used in a mass ratio within the above range, it is possible to obtain a curable composition that produces a cured product that exhibits excellent heat resistance and high adhesion.

Component (D)

The curable composition according to one embodiment of the invention includes a silane coupling agent that includes an acid anhydride structure in its molecule (hereinafter may be referred to as "silane coupling agent (D)"), as a component (D).

The silane coupling agent (D) is an organosilicon compound that includes both a group (Q) including an acid anhydride structure and a hydrolyzable group ($R^e$) in one molecule. More specifically, the silane coupling agent (D) is a compound represented by the following formula (d).

(d)

In the formula (d), Q is an acid anhydride structure, $R^d$ is an alkyl group having 1 to 6 carbon atoms, or a substituted or unsubstituted phenyl group, $R^e$ is an alkoxy group having 1 to 6 carbon atoms, or a halogen atom, i and k are an integer from 1 to 3, and j is an integer from 0 to 2, provided that i+j+k=4. A plurality of $R^d$ may be either identical to or different from each other when j is 2. A plurality of $R^e$ may be either identical to or different from each other when k is 2 or 3. A plurality of Q may be either identical to or different from each other when i is 2 or 3.

Examples of Q include the groups respectively represented by the following formulas (Q1) to (Q4), and the like. The group represented by the formula (Q1) is particularly preferable.

(Q1)

-continued

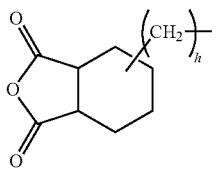
(Q2)

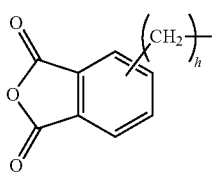
(Q3)

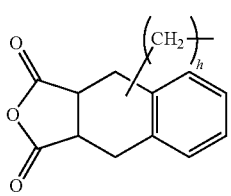
(Q4)

wherein h is an integer from 0 to 10.

Examples of the alkoxy group having 1 to 6 carbon atoms that may be represented by $R^e$ in the formula (d) include a methoxy group, an ethoxy group, a propoxy group, an isopropoxy group, a butoxy group, a t-butoxy group, and the like.

Examples of the halogen atom include a chlorine atom, a bromine atom, and the like.

Examples of the alkyl group having 1 to 6 carbon atoms that may be represented by $R^d$ include those mentioned above in connection with the alkyl group having 1 to 6 carbon atoms that may be represented by $R^1$. Examples of the substituted or unsubstituted phenyl group that may be represented by $R^d$ include those mentioned above in connection with the substituted or unsubstituted phenyl group that may be represented by $R^2$.

A compound represented by the following formula (d-1) is preferable as the compound represented by the formula (d).

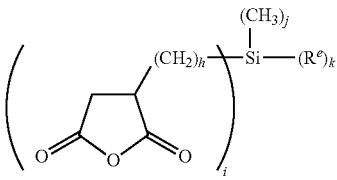
(d-1)

wherein $R^e$, h, i, j, and k are the same as defined above.

h in the formula (d-1) is preferably 2 to 8, more preferably 2 or 3, and particularly preferably 3.

Specific examples of the silane coupling agent represented by the formula (d-1) include a tri($C_{1-6}$)alkoxysilyl($C_{2-8}$)alkylsuccinic anhydride such as 2-(trimethoxysilyl)ethylsuccinic anhydride, 2-(triethoxysilyl)ethylsuccinic anhydride, 3-(trimethoxysilyl)propylsuccinic anhydride, and 3-(triethoxysilyl)propylsuccinic anhydride; a di($C_{1-6}$)alkoxymethylsilyl($C_{2-8}$)alkylsuccinic anhydride such as 2-(dimethoxymethylsilyl)ethylsuccinic anhydride; a ($C_{1-6}$)alkoxydimethylsilyl($C_{2-8}$)alkylsuccinic anhydride such as 2-(methoxydimethylsilyl)ethylsuccinic anhydride; a trihalogenosilyl($C_{2-8}$)alkylsuccinic anhydride such as 2-(trichlorosilyl)ethylsuccinic anhydride and 2-(tribromosilyl)ethylsuccinic anhydride; a dihalogenomethylsilyl($C_{2-8}$)alkylsuccinic anhydride such as 2-(dichloromethylsilyl)ethylsuccinic anhydride; a halogenodimethylsilyl($C_{2-8}$)alkylsuccinic anhydride such as 2-(chlorodimethylsilyl)ethylsuccinic anhydride; and the like.

Among these, a tri($C_{1-6}$)alkoxysilyl($C_{2-8}$)alkylsuccinic anhydride is preferable, and 3-(trimethoxysilyl)propylsuccinic anhydride and 3-(triethoxysilyl)propylsuccinic anhydride are particularly preferable.

These compounds may be used either alone or in combination as the component (D).

It is preferable that the curable composition according to one embodiment of the invention include the component (A) and the component (D) in a mass ratio (component (A): component (D)) of 100:0.01 to 100:30, and more preferably 100:0.1 to 100:10.

When the component (A) and the component (D) are used in a mass ratio within the above range, the curable composition according to one embodiment of the invention produces a cured product that exhibits excellent heat resistance, excellent adhesion, and excellent delamination resistance.

It is preferable that the curable composition according to one embodiment of the invention further include a diluent so that the curable composition according to one embodiment of the invention exhibits fluidity.

Examples of the diluent include diethylene glycol monobutyl ether acetate, glycerol diglycidyl ether, butanediol diglycidyl ether, diglycidylaniline, neopentyl glycol glycidyl ether, cyclohexanedimethanol diglycidyl ether, an alkylene diglycidyl ether, polyglycol diglycidyl ether, polypropylene glycol diglycidyl ether, trimethylolpropane triglycidyl ether, glycerol triglycidyl ether, 4-vinylcyclohexene monoxide, vinylcyclohexene dioxide, methylated vinylcyclohexene dioxide, and the like.

These diluents may be used either alone or in combination.

The diluent is preferably used so that the curable composition according to one embodiment of the invention has a solid content of 50 to 100 mass %, more preferably 60 to 90 mass %, and still more preferably 70 to 85 mass %.

When the curable composition according to one embodiment of the invention includes the diluent, it is preferable that the curable composition according to one embodiment of the invention include the component (A), the component (B), the component (C), and the component (D) in a total ratio of 50 to 100 mass %, and more preferably 60 to 100 mass %, based on the total amount of components included in the curable composition excluding the diluent. When the curable composition according to one embodiment of the invention includes the component (A), the component (B), the component (C), and the component (D) in a total ratio within the above range, the curable composition according to one embodiment of the invention exhibits better heat resistance and adhesion.

The curable composition according to one embodiment of the invention may include an additional component other than the above components as long as the object of the invention is not impaired.

Examples of the additional component include an antioxidant, a UV absorber, a light stabilizer, and the like.

The antioxidant is added to the curable composition in order to prevent deterioration due to oxidation during heating. Examples of the antioxidant include a phosphorus-based antioxidant, a phenol-based antioxidant, a sulfur-based antioxidant, and the like.

Examples of the phosphorus-based antioxidant include phosphites, oxaphosphaphenanthrene oxides, and the like. Examples of the phenol-based antioxidant include monophenols, bisphenols, polyphenols, and the like. Examples of the sulfur-based antioxidant include dilauryl 3,3'-thiodipropionate, dimyristyl 3,3'-thiodipropionate, distearyl 3,3'-thiodipropionate, and the like.

These antioxidants may be used either alone or in combination. The antioxidant is normally used in a ratio of 10 mass % or less based on the component (A).

The UV absorber is added to the curable composition in order to improve the light resistance of the resulting cured product.

Examples of the UV absorber include salicylic acids, benzophenones, benzotriazols, hindered amines, and the like.

These UV absorbers may be used either alone or in combination.

The UV absorber is normally used in a ratio of 10 mass % or less based on the component (A).

The light stabilizer is added to the curable composition in order to improve the light resistance of the resulting cured product.

Examples of the light stabilizer include hindered amines such as poly[{6-(1,1,3,3-tetramethylbutyl)amino-1,3,5-triazine-2,4-diyl}{(2,2,6,6-tetramethyl-4-piperidine)imino}hexamethylene{(2,2,6,6-tetramethyl-4-piperidine)imino}], and the like.

These light stabilizers may be used either alone or in combination.

These additional components (excluding the diluent) are normally used in a total ratio of 20 mass % or less based on the component (A).

The curable composition according to one embodiment of the invention may be obtained by mixing the components (A) to (D), an optional diluent, and an optional additional component in a specific ratio, and mixing and defoaming the mixture using a known method, for example.

The curable composition according to one embodiment of the invention obtained as described above produces a cured product that exhibits excellent delamination resistance, excellent heat resistance, and high adhesion.

Therefore, the curable composition according to one embodiment of the invention is suitably used as a raw material, an adhesive, a coating material, and the like that are used to produce optical parts and formed articles. In particular, since the curable composition according to one embodiment of the invention can solve a problem with regard to deterioration in an optical element-securing material due to an increase in the brightness of an optical element, the curable composition can suitably be used as an optical element-securing composition.

2) Cured Product

A cured product according to one embodiment of the invention is obtained by curing the curable composition according to one embodiment of the invention.

The curable composition according to one embodiment of the invention may be cured by heating the curable composition. The heating temperature employed when curing the curable composition is normally 100 to 200° C., and the heating time employed when curing the curable composition is normally 10 minutes to 20 hours, and preferably 30 minutes to 10 hours.

The cured product according to one embodiment of the invention exhibits high adhesion, excellent delamination resistance, and excellent heat resistance.

Therefore, the cured product according to one embodiment of the invention can solve a problem with regard to deterioration due to an increase in the brightness of an optical element, and may suitably be used as an optical element-securing material. For example, the cured product according to one embodiment of the invention may suitably be used as a raw material, an adhesive, a coating material, and the like that are used to produce optical parts and formed articles.

A cured product obtained by curing the curable composition according to one embodiment of the invention exhibits excellent delamination resistance when the delamination resistance of the cured product is measured as described below, for example.

Specifically, the curable composition is applied to an LED lead frame, and a sapphire chip is compression-bonded thereto. After curing the curable composition by heating at 170° C. for 2 hours, a sealing material is poured into the cup, and heated at 150° C. for 1 hour to obtain a cured product specimen. The specimen is allowed to stand at a temperature of 85° C. and a relative humidity of 85% RH for 168 hours, subjected to an IR reflow process (preheating temperature: 160° C., maximum temperature: 260° C., heating time: 1 minute), and subjected to a thermal cycle test (300 cycles, wherein one cycle consists of allowing the specimen to stand at −40° C. for 30 minutes, and allowing the specimen to stand at +100° C. for 30 minutes) using a thermal cycle tester. The sealing material is then removed to determine whether or not the element is removed (delaminated) together with the sealing material. The delamination probability with respect to the cured product according to one embodiment of the invention is normally 45% or less, and preferably 25% or less.

A cured product obtained by curing the curable composition according to one embodiment of the invention exhibits high adhesion when the adhesion of the cured product is measured as described below, for example. Specifically, the curable composition is applied to a mirror-finished surface of a silicon chip. The surface of the silicon chip to which the curable composition has been applied is placed on and compression-bonded to an adherend, and the curable composition is cured by heating. After allowing the resulting product to stand for 30 seconds on the measurement stage of a bond tester that has been heated to a specific temperature (e.g., 23 or 100° C.), the adhesion between the specimen and the adherend is measured while applying a stress to the bonding surface in the horizontal direction (shear direction) at a height of 50 μm above the adherend.

It is preferable that the cured product have an adhesion at 23° C. of 60 N/mm$^2$ or more, more preferably 80 N/mm$^2$ or more, and particularly preferably 100 N/mm$^2$ or more. It is preferable that the cured product have an adhesion at 100° C. of 40 N/mm$^2$ or more, more preferably 50 N/mm$^2$ or more, and particularly preferably 60 N/mm$^2$ or more.

3) Method for Using Curable Composition

A method for using a curable composition according to one embodiment of the invention uses the curable composition according to one embodiment of the invention as an optical element-securing composition (e.g., optical element adhesive or optical element sealing material).

Examples of the optical element include a light-emitting element (e.g., LED and LD), a light-receiving element, a hybrid optical element, an optical integrated circuit, and the like.

Optical Element Adhesive

The curable composition according to one embodiment of the invention may suitably be used as an optical element adhesive.

When the curable composition according to one embodiment of the invention is used as an optical element adhesive, the curable composition is applied to the bonding surface of either or both of the bonding target materials (e.g., optical element and substrate), the bonding target materials are compression-bonded, and the curable composition is cured by heating to firmly bond the bonding target materials, for example.

Examples of a material for forming the substrate to which the optical element is bonded, include glasses such as soda lime glass and heat-resistant hard glass; a ceramic; metals such as iron, copper, aluminum, gold, silver, platinum, chromium, titanium, an alloy thereof, and stainless steel (e.g., SUS302, SUS304, SUS304L, and SUS309); a synthetic resin such as polyethylene terephthalate, polybuthylene terephthalate, polyethylene naphthalate, an ethylene-vinyl acetate copolymer, polystyrene, a polycarbonate, polymethylpentene, a polysulfone, polyether ether ketone, polyethersulfone, polyphenylene sulfide, polyetherimide, a polyimide, a polyamide, an acrylic resin, a norbornene resin, a cycloolefin resin, and a glass epoxy resin; and the like.

The heating temperature employed when curing the curable composition is selected taking account of the type of curable composition and the like, but is normally 100 to 200° C. The heating time is normally 10 minutes to 20 hours, and preferably 30 minutes to 10 hours.

Optical Element Sealing Material

The curable composition according to one embodiment of the invention may suitably be used as an optical element sealing material (i.e., a sealing material for producing a sealed optical element).

When the curable composition according to one embodiment of the invention is used as an optical element sealing material, the curable composition is formed so as to have the desired shape to obtain a formed article that includes an optical element, and the formed article is cured by heating to produce a sealed optical element, for example. The curable composition according to one embodiment of the invention may be formed to have the desired shape using an arbitrary method. A known forming method such as a transfer forming method and a casting method may be used.

The heating temperature employed when curing the formed article (curable composition) is selected taking account of the type of curable composition and the like, but is normally 100 to 200° C. The heating time is normally 10 minutes to 20 hours, and preferably 30 minutes to 10 hours.

Since the sealed optical element is produced using the curable composition according to one embodiment of the invention, the sealed optical element exhibits excellent delamination resistance, excellent heat resistance, and high adhesion.

4) Optical Device

An optical device according to one embodiment of the invention is produced using the curable composition according to one embodiment of the invention as an optical element-securing adhesive or an optical element sealing material.

The optical device according to one embodiment of the invention is produced by securing an optical element on a support substrate using the curable composition according to one embodiment of the invention as an optical element-securing adhesive or an optical element sealing material. Therefore, the optical device according to one embodiment of the invention has a structure in which the optical element is secured with high adhesion, and exhibits excellent durability.

Examples of the optical element include a light-emitting element (e.g., LED and LD), a light-receiving element, a hybrid optical element, an optical integrated circuit, and the like.

EXAMPLES

The invention is further described below by way of examples and comparative examples. Note that the invention is not limited to the following examples. The units "%" and "parts" used in connection with the examples and the comparative examples respectively refer to "mass %" and "parts by mass" unless otherwise indicated.

Measurement of Mass Average Molecular Weight

The standard polystyrene-equivalent mass average molecular weight (Mw) and the standard polystyrene-equivalent number average molecular weight (Mn) of the silane compound (co)polymer obtained in each production example were determined using the device listed below under the conditions listed below.

Device: HLC-8220 GPC manufactured by Tosoh Corporation
Column: TSKgel GMHXL, TSKgel GMHXL, and TSKgel 2000HXL were connected in series
Eluent: tetrahydrofuran
Injection amount: 80
Temperature: 40° C.
Flow rate: 1 ml/min
Detector: differential refractometer Measurement of IR Spectrum The IR spectrum of the silane compound (co)polymer obtained in each production example was measured using a Fourier transform infrared spectrometer ("Spectrum 100" manufactured by PerkinElmer).

Production Example 1

A 300 ml recovery flask was charged with 20.2 g (102 mmol) of phenyltrimethoxysilane (manufactured by Tokyo Chemical Industry Co., Ltd., hereinafter the same), 3.15 g (18 mmol) of 2-cyanoethyltrimethoxysilane (manufactured by AZmax Co., hereinafter the same), 96 ml of acetone (solvent), and 24 ml of distilled water. After the addition of 0.15 g (1.5 mmol) of phosphoric acid (manufactured by Kanto Chemical Co., Inc., hereinafter the same) (catalyst) with stirring, the mixture was stirred at 25° C. for a further 16 hours.

After completion of the reaction, the reaction mixture was concentrated to 50 ml using an evaporator. After the addition of 100 ml of ethyl acetate to the concentrate, the mixture was neutralized using a saturated sodium hydrogen carbonate aqueous solution. After allowing the mixture to stand for a while, the organic layer was isolated preparatively. The organic layer was washed twice with distilled water, and dried over anhydrous magnesium sulfate. After separating magnesium sulfate by filtration, the filtrate was concentrated to 50 ml using an evaporator, and the concentrate was added dropwise to a large quantity of n-hexane to effect precipitation. The resulting precipitate was separated by decantation. The precipitate thus separated was dissolved in methyl ethyl ketone (MEK), and the solvent was evaporated under reduced pressure using an evaporator. The residue was dried under vacuum to obtain 13.5 g of a silane compound copolymer (A1).

The silane compound copolymer (A1) had a mass average molecular weight (Mw) of 1,870 and a molecular weight distribution (Mw/Mn) of 1.42.

The IR spectral data of the silane compound copolymer (A1) is shown below. Si-Ph: 698 cm$^{-1}$, 740 cm$^{-1}$, Si—O: 1132 cm$^{-1}$, —CN: 2259 cm$^{-1}$ Production Example 2

A 300 ml recovery flask was charged with 71.37 g (400 mmol) of methyltriethoxysilane ("KBE-13" manufactured by Shin-Etsu Chemical Co., Ltd.). After the addition of an aqueous solution prepared by dissolving 0.10 g (0.25 mol % based on the total amount of silane compound) of 35% hydrochloric acid in 21.6 ml of distilled water with stirring, the mixture was stirred at 30° C. for 2 hours, and then stirred at 70° C. for 5 hours. After the addition of 140 g of propyl acetate, the mixture was stirred. After the addition of 0.12 g (0.5 mol % based on the total amount of silane compound) of 28% aqueous ammonia to the mixture with stirring, the resulting mixture was heated to 70° C., and stirred for 3 hours. Purified water was added to the reaction mixture to effect separation. This operation was repeated until the aqueous layer had a pH of 7. The organic layer was concentrated using an evaporator, and the concentrate was dried under vacuum to obtain 55.7 g of a silane compound polymer (A2). The silane compound polymer (A2) had a mass average molecular weight (Mw) of 7,800 and a molecular weight distribution (PDI) of 4.52.

The IR spectral data of the silane compound polymer (A2) is shown below. Si—CH$_3$: 1272 cm$^{-1}$, 1409 cm$^{-1}$, Si—O: 1132 cm$^{-1}$ Example 1

A silicone filler having an average primary particle size of 0.5 μm ("MSP-SN05" manufactured by Nikko Rica Corporation) (component (B)) (1 part (part by mass (hereinafter the same))), 1,3,5-N-tris[3-(trimethoxysilyl)propyl] isocyanurate (component (C)) (10 parts), 3-(trimethoxysilyl)propylsuccinic anhydride (component (D)) (1 part), and diethylene glycol monobutyl ether acetate, were added to the silane compound copolymer (A1) (100 parts) obtained in Production Example 1. Note that diethylene glycol monobutyl ether acetate was added so that the solid content in the mixture was 80%. The mixture was sufficiently mixed and defoamed to obtain a curable composition 1.

Examples 2 to 33 and Comparative Examples 1 to 13

Curable compositions 2 to 33 of Examples 2 to 33 and curable compositions 1r to 13r of Comparative Examples 1 to 13 were obtained in the same manner as in Example 1, except that the type of the silane compound (co)polymer (component (A)), the type and the amount (parts) of the component (B), the amount (parts) of the component (C), and the amount (parts) of the component (D), were changed as listed in Table 1.

Note that the meanings of the symbols "B1" to "B9" listed in Table 1 in connection with component (B) are as follows.
B1: Silicone-based fine particles ("MSP-SN05" manufactured by Nikko Rica Corporation, average primary particle size: 0.5 μm)
B2: Silicone-based fine particles ("MSP-SN08" manufactured by Nikko Rica Corporation, average primary particle size: 0.8 μm)
B3: Silicone-based fine particles ("Tospearl 120" manufactured by Momentive Performance Materials Japan LLC, average primary particle size: 2 μm)
B4: Silicone-based fine particles ("Tospearl 145" manufactured by Momentive Performance Materials Japan LLC, average primary particle size: 4.5 μm)
B5: Silicone-coated aluminum oxide ("MSP-AK06" manufactured by Nikko Rica Corporation, average primary particle size: 6 μm)
B6: Silicone-coated titanium oxide ("MSP-TK04" manufactured by Nikko Rica Corporation, average primary particle size: 4 μm)
B7: Silicone-coated titanium oxide ("MSP-TS04" manufactured by Nikko Rica Corporation, average primary particle size: 4 μm)
B8: Silicone-based fine particles ("MSP-3500" manufactured by Nikko Rica Corporation, average primary particle size: 5 μm)
B9: Silica-based fine particles ("SILFIL NSS-5N" manufactured by Tokuyama Corporation, average primary particle size: 0.07 μm)

The adhesion and the delamination resistance of cured products obtained using the curable compositions 1 to 33 of Examples 1 to 33 and the curable compositions 1r to 13r of Comparative Examples 1 to 13 were measured or evaluated as described below.

The measurement results and the evaluation results are listed in Table 1.
Measurement of Adhesion The curable composition (curable compositions 1 to 33 and 1r to 13r) was applied to a mirror-finished surface of a silicon chip (2×2 mm) to a thickness of about 2 μm. The surface of the silicon chip to which the curable composition had been applied was placed on and compression-bonded to an adherend (silver-plated copper sheet). The curable composition was cured by heating at 170° C. for 2 hours to prepare a specimen-bonded adherend. After allowing the specimen-bonded adherend to stand for 30 seconds on a measurement stage of a bond tester ("Series 4000" manufactured by Dage Co., Ltd.) that had been heated to a specific temperature (23° C. or 100° C.), the adhesion (N/mm$^2$) (at 23° C. and 100° C.) between the specimen and the adherend was measured while applying a stress (speed: 200 μm/s) to the bonding surface in the horizontal direction (shear direction) at a height of 50 μm above the adherend.
Delamination Resistance Test The curable composition (curable compositions 1 to 33 and 1r to 13r) was applied to an LED lead frame ("5050 D/G PKG LEAD FRAME" manufactured by Enomoto Co., Ltd.) to a diameter of about 0.4 mm, and a sapphire chip (0.5×0.5 mm) was compression-bonded thereto. After curing the curable composition by heating at 170° C. for 2 hours, a sealing material ("EG6301" manufactured by Shin-Etsu Chemical Co., Ltd.) was poured into the cup, and heated at 150° C. for 1 hour to obtain a specimen.

The specimen was allowed to stand at a temperature of 85° C. and a relative humidity of 85% RH for 168 hours, and subjected to an IR reflow process (preheating temperature: 160° C., maximum temperature: 260° C., heating time: 1 minute) (reflow oven: "WL-15-20DNX" manufactured by Sagami-Rikou Co. Ltd.). The specimen that had been subjected to the IR reflow process was subjected to a thermal cycle test (300 cycles, wherein one cycle consists of allowing the specimen to stand at −40° C. for 30 minutes, and allowing the specimen to stand at +100° C. for 30 minutes) using a thermal cycle tester. The sealing material was then removed to determine whether or not the element was removed (delaminated) together with the sealing material. Each curable composition was subjected to this test 12 times.

The number of times that the element was removed (delaminated) together with the sealing material was counted. A case where the delamination rate was 25% or less was evaluated as "A", a case where the delamination rate was more than 25% and 50% or less was evaluated as "B", and a case where the delamination rate was more than 50% was evaluated as "C" (see Table 1).

As is clear from the results listed in Table 1, the cured products of the curable compositions 1 to 33 of Examples 1 to 33 exhibited excellent delamination resistance (i.e., the evaluation result was "A" or "B"). The cured products of the curable compositions 1 to 33 of Examples 1 to 33 also exhibited excellent adhesion and excellent heat resistance (i.e., the adhesion at 23° C. was 67 N/mm$^2$ or more (mainly 70 N/mm$^2$ or more), and the adhesion at 100° C. was 42 N/mm$^2$ or more (mainly 45 N/mm$^2$ or more)).

TABLE 1

| | (A) 100 parts | (B) Type | (B) (parts) | (C1) (parts) | (D1) (parts) | Adhesion (N/mm$^2$) 23° C. | Adhesion (N/mm$^2$) 100° C. | Delamination resistance |
|---|---|---|---|---|---|---|---|---|
| Example 1 | A1 | B1 | 1 | 10 | 1 | 85.86 | 57.98 | B |
| Example 2 | A1 | B1 | 3 | 10 | 1 | 84.77 | 49.40 | B |
| Example 3 | A1 | B1 | 5 | 10 | 1 | 88.52 | 42.21 | B |
| Example 4 | A1 | B1 | 10 | 10 | 1 | 67.09 | 45.09 | B |
| Example 5 | A1 | B2 | 1 | 10 | 1 | 96.41 | 49.02 | A |
| Example 6 | A1 | B2 | 3 | 10 | 1 | 89.00 | 45.51 | B |
| Example 7 | A1 | B2 | 5 | 10 | 1 | 73.05 | 53.21 | A |
| Example 8 | A1 | B2 | 10 | 10 | 1 | 71.93 | 53.22 | A |
| Example 9 | A1 | B3 | 3 | 10 | 1 | 122.28 | 79.90 | A |
| Example 10 | A1 | B4 | 3 | 10 | 1 | 128.42 | 64.73 | A |
| Example 11 | A1 | B5 | 3 | 10 | 1 | 98.73 | 55.19 | A |
| Example 12 | A1 | B6 | 3 | 10 | 1 | 132.86 | 62.99 | A |
| Example 13 | A1 | B7 | 3 | 10 | 1 | 123.10 | 55.61 | A |
| Example 14 | A1 | B8 | 3 | 10 | 1 | 97.23 | 58.63 | A |
| Example 15 | A1 | B1/B3 | 1.5/1.5 | 10 | 1 | 121.87 | 79.77 | A |
| Example 16 | A1 | B2/B3 | 1.5/1.5 | 10 | 1 | 117.07 | 69.01 | B |
| Example 17 | A2 | B1 | 1 | 10 | 3 | 157.38 | 108.14 | B |
| Example 18 | A2 | B1 | 3 | 10 | 3 | 117.02 | 89.57 | A |
| Example 19 | A2 | B1 | 5 | 10 | 3 | 125.16 | 88.84 | B |
| Example 20 | A2 | B1 | 10 | 10 | 3 | 128.53 | 69.11 | A |
| Example 21 | A2 | B2 | 1 | 10 | 3 | 137.24 | 106.06 | A |
| Example 22 | A2 | B2 | 3 | 10 | 3 | 130.16 | 88.93 | B |
| Example 23 | A2 | B2 | 5 | 10 | 3 | 132.48 | 77.08 | A |
| Example 24 | A2 | B2 | 10 | 10 | 3 | 87.61 | 57.54 | A |
| Example 25 | A2 | B3 | 3 | 10 | 3 | 124.66 | 81.42 | A |
| Example 26 | A2 | B4 | 3 | 10 | 3 | 138.97 | 80.40 | A |
| Example 27 | A2 | B5 | 3 | 10 | 3 | 100.93 | 53.55 | A |
| Example 28 | A2 | B6 | 3 | 10 | 3 | 167.16 | 100.95 | A |
| Example 29 | A2 | B7 | 3 | 10 | 3 | 111.31 | 67.78 | A |
| Example 30 | A2 | B8 | 3 | 10 | 3 | 146.26 | 86.64 | A |
| Example 31 | A2 | B1/B3 | 1.5/1.5 | 10 | 3 | 165.69 | 109.56 | A |
| Example 32 | A2 | B2/B3 | 1.5/1.5 | 10 | 3 | 153.83 | 124.73 | A |
| Example 33 | A2 | B9 | 3 | 10 | 3 | 125.23 | 100.24 | A |

TABLE 2

| | (A) 100 parts | (B) Type | (B) (parts) | (C1) (parts) | (D1) (parts) | Adhesion (N/mm$^2$) 23° C. | Adhesion (N/mm$^2$) 100° C. | Delamination resistance |
|---|---|---|---|---|---|---|---|---|
| Comparative Example 1 | A1 | — | — | — | — | 31.84 | 8.99 | C |
| Comparative Example 2 | A1 | B1 | 3 | — | — | 76.62 | 41.25 | C |
| Comparative Example 3 | A1 | B2 | 3 | — | — | 71.40 | 43.50 | C |
| Comparative Example 4 | A1 | B3 | 3 | — | — | 69.31 | 33.84 | C |
| Comparative Example 5 | A1 | B4 | 3 | — | — | 45.69 | 18.85 | B |
| Comparative Example 6 | A1 | B9 | 3 | — | — | 125.23 | 100.24 | C |
| Comparative Example 7 | A1 | — | — | 10 | 1 | 65.99 | 47.89 | C |
| Comparative Example 8 | A2 | — | — | — | — | 39.97 | 33.65 | C |
| Comparative Example 9 | A2 | B1 | 3 | — | — | 94.56 | 31.33 | C |
| Comparative Example 10 | A2 | B2 | 3 | — | — | 86.78 | 24.70 | C |
| Comparative Example 11 | A2 | B3 | 3 | — | — | 75.24 | 36.54 | C |
| Comparative Example 12 | A2 | B4 | 3 | — | — | 90.37 | 27.67 | C |
| Comparative Example 13 | A2 | B9 | 3 | — | — | 97.91 | 31.85 | C |

On the other hand, most of the cured products of the curable compositions of Comparative Examples 1 to 13 had an adhesion of 70 N/mm² or less. In particular, the cured products of the curable compositions of Comparative Examples 1 to 5 and 8 to 13 had an adhesion at 100° C. of less than 45 N/mm² (i.e., exhibited inferior adhesion). The cured products of the curable compositions of Comparative Examples 1 to 4 and 6 to 13 exhibited inferior delamination resistance. The curable composition of Comparative Example 5 was evaluated as "B" with regard to the delamination resistance, but exhibited inferior adhesion and inferior heat resistance (i.e., the adhesion at 100° C. was 18.85 N/mm²).

The invention claimed is:

1. A curable composition comprising a component (A), a component (B), a component (C), and a component (D), the curable composition comprising the component (A) and the component (B) in a mass ratio (component (A):component (B)) of 100:0.3 to 100:20, the component (A) being a silane compound (co)polymer that is represented by a formula (a-1) or a formula (a-2),

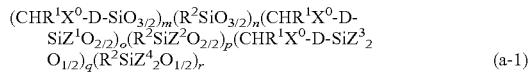
(a-1)

wherein $X^0$ is a halogen atom, a cyano group, or a group represented by OG (wherein G is a protecting group for a hydroxy group), D is a single bond, or a substituted or unsubstituted divalent organic group having 1 to 20 carbon atoms, $R^1$ is a hydrogen atom or an alkyl group having 1 to 6 carbon atoms, $R^2$ is an alkyl group having 1 to 20 carbon atoms, or a substituted or unsubstituted phenyl group, $Z^1$ to $Z^4$ are independently a hydroxy group, an alkoxy group having 1 to 10 carbon atoms, or a halogen atom, m and n are independently a positive integer, and o, p, q, and r are independently 0 or a positive integer,

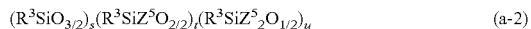
(a-2)

wherein $R^3$ is an alkyl group having 1 to 10 carbon atoms, provided that a plurality of $R^3$ are either identical to or different from each other when a plurality of $R^3$ are present, $Z^5$ is a hydroxy group, an alkoxy group having 1 to 10 carbon atoms, or a halogen atom, s is a positive integer, and t and u are independently 0 or a positive integer, the component (B) being fine particles having an average primary particle size of more than 0.04 μm and 8 μm or less, the component (C) being a silane coupling agent that comprises a nitrogen atom in its molecule, and the component (D) being a silane coupling agent that comprises an acid anhydride structure in its molecule.

2. The curable composition according to claim 1, wherein the component (B) is at least one type of fine particles selected from silica, a silicone, and a silicone-coated metal oxide.

3. The curable composition according to claim 1, wherein the component (B) is fine particles of silicone-coated titanium oxide or silicone-coated aluminum oxide.

4. The curable composition according to claim 1, wherein the component (A) has a mass average molecular weight of 800 to 30,000.

5. The curable composition according to claim 1, wherein the component (A) is a compound represented by the formula (a-1) wherein a ratio ((m+o+q):(n+p+r)) of (m+o+q) to (n+p+r) is 5:95 to 60:40.

6. The curable composition according to claim 1, further comprising a diluent.

7. The curable composition according to claim 6, comprising the component (A), the component (B), the component (C), and the component (D) in a total ratio of 50 to 100 mass % based on a total amount of components included in the curable composition excluding the diluent.

8. The curable composition according to claim 1, having a solid content of 50 to 100 mass %.

9. The curable composition according to claim 1, the curable composition being an optical element-securing composition.

10. A cured product obtained by curing the curable composition according to claim 1.

11. The cured product according to claim 10, the cured product being an optical element-securing material.

12. A method for using the curable composition according to claim 1 as an optical element-securing adhesive, said method comprising applying the curable composition to a bonding surface of either or both of bonding target materials, wherein the bonding target materials are compression-bonded, and heating to cure the curable composition to bond the bonding target materials.

13. A method for using the curable composition according to claim 1 as an optical element sealing material, said method comprising forming the curable composition into a shape to obtain a formed article that includes an optical element, and heating to cure the formed article.

14. An optical device produced using the curable composition according to claim 1 as an optical element-securing adhesive or an optical element sealing material.

* * * * *